(12) United States Patent
Sakai et al.

(10) Patent No.: US 12,495,489 B2
(45) Date of Patent: Dec. 9, 2025

(54) PRINTED WIRING BOARD

(71) Applicant: IBIDEN CO., LTD., Gifu (JP)

(72) Inventors: Jun Sakai, Ogaki (JP); Shiho Shimada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 30 days.

(21) Appl. No.: 18/191,062

(22) Filed: Mar. 28, 2023

(65) Prior Publication Data

US 2023/0319987 A1 Oct. 5, 2023

(30) Foreign Application Priority Data

Mar. 29, 2022 (JP) .................................. 2022-052979
Feb. 15, 2023 (JP) .................................. 2023-021710

(51) Int. Cl.
 *H05K 1/11* (2006.01)
 *H05K 1/02* (2006.01)
 *H05K 3/18* (2006.01)
 *H05K 3/42* (2006.01)

(52) U.S. Cl.
 CPC ........... *H05K 1/0298* (2013.01); *H05K 1/115* (2013.01); *H05K 3/188* (2013.01); *H05K 3/424* (2013.01); *H05K 2201/096* (2013.01); *H05K 2201/09827* (2013.01)

(58) Field of Classification Search
 CPC ...... H05K 1/0298; H05K 1/115; H05K 1/113; H05K 3/188; H05K 3/42–428; H05K 3/4611; H05K 2201/096; H05K 2201/09827; H05K 2201/0236; H05K 2201/0338; H05K 2203/0716
 See application file for complete search history.

(56) References Cited

U.S. PATENT DOCUMENTS

| | | | | |
|---|---|---|---|---|
| 6,217,988 B1 * | 4/2001 | Yasue | ................... | H05K 3/0094 428/209 |
| 2009/0283497 A1 * | 11/2009 | Kondo | ................... | H05K 3/108 216/13 |
| 2012/0031648 A1 * | 2/2012 | Ebe | .......................... | H05K 1/09 174/250 |
| 2015/0041192 A1 * | 2/2015 | Han | ....................... | H05K 3/108 174/268 |

(Continued)

FOREIGN PATENT DOCUMENTS

JP H11-214828 A 8/1999

*Primary Examiner* — Roshn K Varghese
(74) *Attorney, Agent, or Firm* — Finnegan, Henderson, Farabow, Garrett & Dunner, LLP

(57) ABSTRACT

A printed wiring board includes a first conductor layer, an insulating layer formed on the first conductor layer, a second conductor layer formed on a surface of the insulating layer and including a conductor circuit, and a via conductor formed in an opening formed in the insulating layer and connecting the first and second conductor layers. The second conductor layer and via conductor include a seed layer and an electrolytic plating layer formed on the seed layer such that the seed layer has a first layer and a second layer formed on the first layer, the first layer has a width greater than a width of the second layer in cross section of the conductor circuit in the second conductor layer and that the electrolytic plating layer has a width greater than the width of the first layer in cross section of the conductor circuit in the second conductor layer.

20 Claims, 6 Drawing Sheets

(56) References Cited

U.S. PATENT DOCUMENTS

2015/0357276 A1* 12/2015 Shimizu ............... H05K 3/0055
                                                        361/783
2018/0054885 A1*  2/2018 Takenaka ............. H05K 1/0213
2018/0166372 A1*  6/2018 Shimizu ............... H05K 3/4644
2022/0071016 A1   3/2022 Hwang et al.

* cited by examiner

PRINTED WIRING BOARD

CROSS-REFERENCE TO RELATED APPLICATIONS

The present application is based upon and claims the benefit of priority to Japanese Patent Applications No. 2022-052979, filed Mar. 29, 2022 and No. 2023-021710, filed Feb. 15, 2023. The entire contents of these applications are incorporated herein by reference.

BACKGROUND OF THE INVENTION

Field of the Invention

The present invention relates to a printed wiring board.

Description of Background Art

Japanese Patent Application Laid-Open Publication No. H11-214828 describes a printed wiring board having an insulating layer and a conductive circuit formed on the insulating layer. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on a surface of the resin insulating layer and including a conductor circuit, and a via conductor formed in an opening formed in the resin insulating layer such that the via conductor is connecting the first conductor layer and the second conductor layer. The second conductor layer and the via conductor include a seed layer and an electrolytic plating layer formed on the seed layer such that the seed layer has a first layer and a second layer formed on the first layer, that the first layer has a width that is greater than a width of the second layer in a cross section of the conductor circuit in the second conductor layer and that the electrolytic plating layer has a width that is greater than the width of the first layer in the cross section of the conductor circuit in the second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
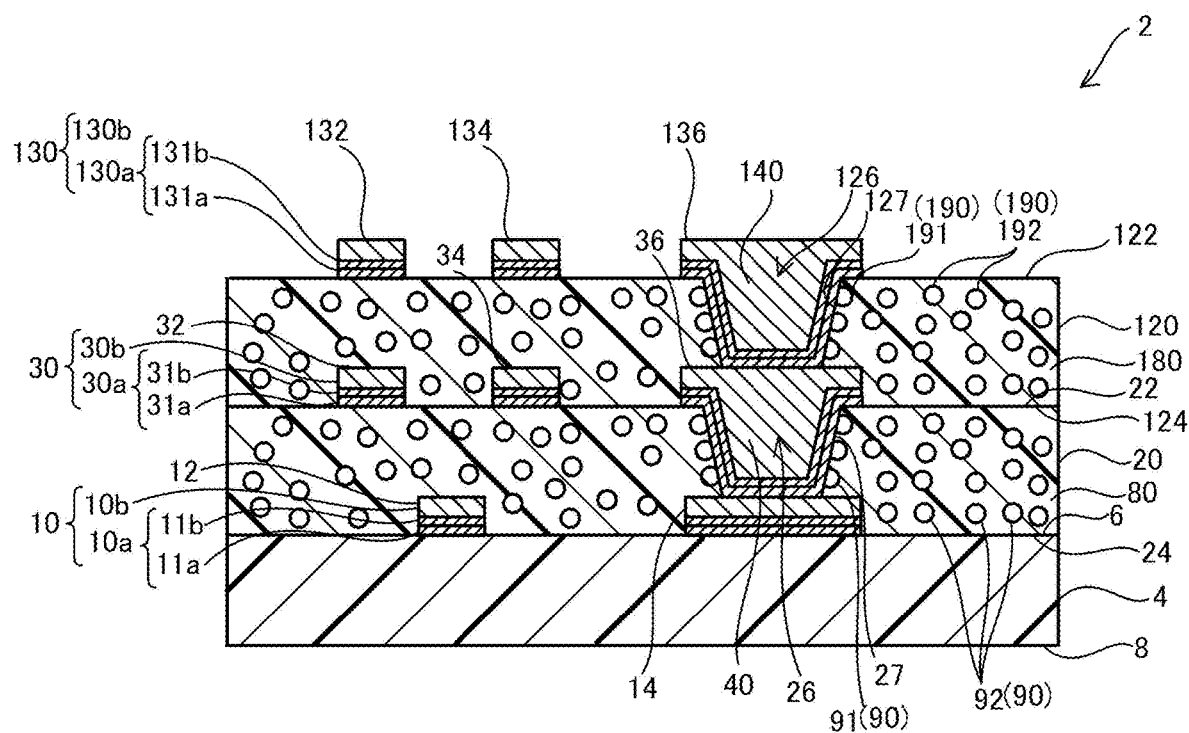
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
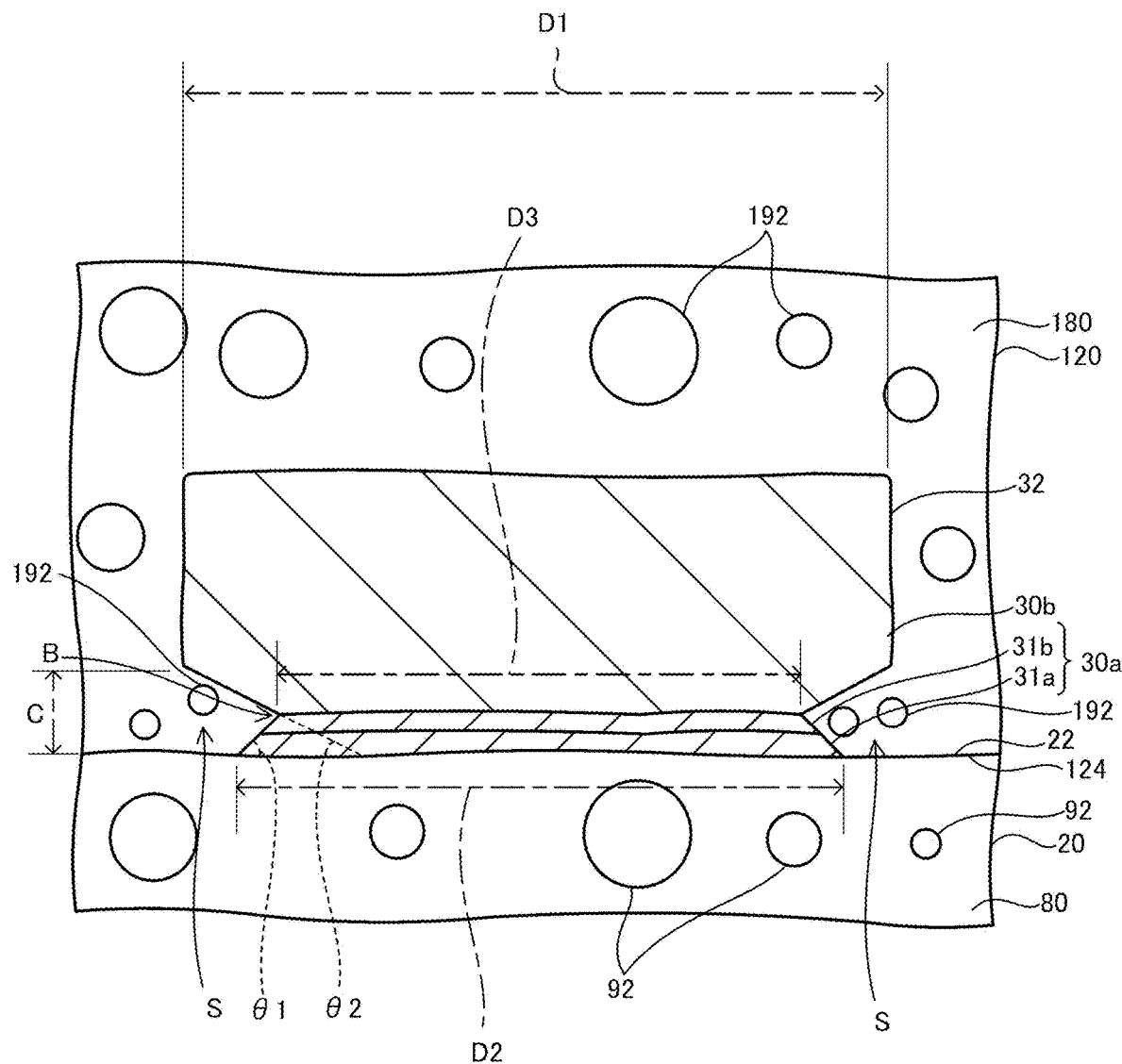
FIG. 2 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2 is an enlarged cross-sectional view illustrating a part of the printed wiring board 2 of the embodiment. As illustrated in FIG. 1, the printed wiring board 2 has an insulating layer 4, a first conductor layer 10, a first resin insulating layer 20, a second conductor layer 30, a first via conductor 40, a second resin insulating layer 120, a third conductor layer 130, and a second via conductor 140.

The insulating layer 4 is formed using a resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by a first layer (11a) on the third surface 6 and a second layer (1l b) on the first layer (11a). The first layer (11a) is formed of a copper alloy containing copper and a metal other than copper. The second layer (11b) is formed of copper. The electrolytic plating layer (10b) is formed of copper. The first layer (11a) is in contact with the insulating layer 4.

The first resin insulating layer 20 is formed on the third surface 6 of the insulating layer 4 and on the first conductor layer 10. The first resin insulating layer 20 has a first surface 22 (upper surface in the drawing) and a second surface 24 (lower surface in the drawing) on the opposite side with respect to the first surface 22. The second surface 24 of the first resin insulating layer 20 faces the first conductor layer 10. The first resin insulating layer 20 has an opening 26 that exposes the pad 14. The first resin insulating layer 20 is formed of a resin 80 and a large number of inorganic particles 90 dispersed in the resin 80. The resin 80 is an epoxy resin. Examples of the resin 80 include a thermosetting resin and a photocurable resin. Examples of the inorganic particles 90 include silica particles and alumina particles. The inorganic particles 90 have a size range of 0.1 µm or more and 5.0 µm or less, and have an average particle size of 0.5 µm.

As illustrated in FIG. 1, the inorganic particles 90 include first inorganic particles 91 forming an inner wall surface 27 of the opening 26 and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

As illustrated in FIG. 1, the first surface 22 of the first resin insulating layer 20 is mostly formed of the resin 80. A small amount of the inorganic particles 90 (second inorganic particles 92) are exposed from the first surface 22. No unevenness is formed on the first surface 22 of the first resin insulating layer 20. The first surface 22 is not roughened. The first surface 22 is formed smooth. The first surface 22 has an arithmetic mean roughness (Ra) of 0.02 µm or more and 0.06 µm or less.

The inner wall surface 27 of the opening 26 is formed of the resin 80 and the first inorganic particles 91. The first inorganic particles 91 each have a flat part. The inner wall surface 27 is formed of the resin 80 and the flat parts of the first inorganic particles 91. The inner wall surface 27 is formed smooth.

The flat parts of the first inorganic particles 91 substantially match a surface obtained by extending the surface of the resin 80 formed around the first inorganic particles 91 (a surface that forms the inner wall surface 27). The inner wall surface 27 is illustrated in FIG. 3E. A surface (80a) of the resin and the flat parts (91a), which form the inner wall surface 27, are illustrated in FIG. 3E. The flat parts (91a) drawn with substantially straight lines in FIG. 3E each mean a flat surface. In the cross section illustrated in FIG. 3E, the flat parts (91a) are each a flat surface. It is also possible that the flat parts (91a) are not each a perfect flat surface. The flat parts (91a) are each substantially a flat surface and are each substantially a smooth surface.

In the cross-section illustrated in FIG. 3E, the opening 26 is illustrated to have a substantially inverted trapezoidal shape. However, the opening 26 has actually a substantially inverted truncated cone shape. Therefore, the inner wall surface (side wall) 27 of the opening 26 is actually a substantially curved surface. That is, the common surface formed by the flat parts (91a) and the resin 80 includes the inner wall surface (side wall) 27 formed as a substantially curved surface.

The second conductor layer 30 is formed on the first surface 22 of the first resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by a first layer (31a) on the first surface 22 and a second layer (31b) on the first layer (31a). The first layer (31a) is formed of a copper alloy containing copper and a metal other than copper. The second layer (31b) is formed of copper. The electrolytic plating layer (30b) is formed of copper. The first layer (31a) is in contact with the first surface 22. The second layer (31b) adheres to the electrolytic plating layer (30b). A surface of the second conductor layer 30 facing the first surface 22 of the first resin insulating layer 20 is formed along a surface shape of the first surface 22. The second conductor layer 30 does not enter an inner side of the first surface 22 of the first resin insulating layer 20.

The first via conductor 40 is formed in the opening 26. The first via conductor 40 connects the first conductor layer 10 and the second conductor layer 30. In FIG. 1, the first via conductor 40 connects the pad 14 and the land 36. The first via conductor 40 is formed of a seed layer (30a) and an electrolytic plating layer (30b) on the seed layer (30a). The seed layer (30a) forming the first via conductor 40 and the seed layer (30a) forming the second conductor layer 30 are common. The first layer (31a) is in contact with the inner wall surface 27.

The second resin insulating layer 120 is formed on the first surface 22 of the first resin insulating layer 20 and on the second conductor layer 30. The second resin insulating layer 120 has a fifth surface 122 (upper surface in the drawing) and a sixth surface 124 on the opposite side with respect to the fifth surface 122 (lower surface in the drawing). The sixth side 124 of the second resin insulating layer 120 faces the second conductor layer 30. The second resin insulating layer 120 has an opening 126 that exposes the land 36. The second resin insulating layer 120 is formed of a resin 180 and a large number of inorganic particles 190 dispersed in the resin 180. The resin 180 and the inorganic particles 190 are respectively the same as the resin 80 and the inorganic particles 90 of the first resin insulating layer 20. The inorganic particles 190 include first inorganic particles 191 forming an inner wall surface 127 of the opening 126 and second inorganic particles 192 embedded in the resin 180. The second inorganic particles 192 each have a spherical shape. The first inorganic particles 191 each have a shape obtained by cutting a sphere along a flat surface. The first inorganic particles 191 and the first inorganic particles 91 have the same shape.

The fifth surface 122 of the second resin insulating layer 120 is formed mostly of the resin 180. A small amount of the inorganic particles 190 (second inorganic particles 192) are exposed from the fifth surface 122. No unevenness is formed on the fifth surface 122 of the second resin insulating layer 120. The fifth surface 122 is not roughened. The fifth surface 122 is formed smooth.

The inner wall surface 127 of the opening 126 is formed of the resin 180 and the first inorganic particles 191. The inner wall surface 127 is formed of the resin 180 and flat parts of the first inorganic particles 191. The inner wall surface 127 is formed smooth. The flat parts of the first inorganic particles 191 and the flat parts (91a) of the first inorganic particles 91 are the same.

The third conductor layer 130 is formed on the fifth surface 122 of the second resin insulating layer 120. The third conductor layer 130 includes a first signal wiring 132, a second signal wiring 134, and a land 136. Although not illustrated in the drawing, the third conductor layer 130 also includes conductor circuits other than the first signal wiring 132, the second signal wiring 134, and the land 136. The first signal wiring 132 and the second signal wiring 134 form a pair wiring. The third conductor layer 130 is mainly formed of copper. The third conductor layer 130 is formed by a seed layer (130a) on the fifth surface 122 and an electrolytic plating layer (130b) on the seed layer (130a). The seed layer (130a) and the electrolytic plating layer (130b) are the same as the seed layer (30a) and the electrolytic plating layer (30b) of the second conductor layer 30. The seed layer (130a) is formed by a first layer (131a) on the fifth surface 122 and a second layer (131b) on the first layer (131a). The first layer (131a) is formed of a copper alloy containing copper and a metal other than copper. The second layer (131b) is formed of copper. The electrolytic plating layer (130b) is formed of copper. The first layer (131a) is in contact with the fifth surface 122. A surface of the third conductor layer 130 facing the fifth surface 122 of the second resin insulating layer 120 is formed along a surface shape of the fifth surface 122. The third conductor layer 130 does not enter an inner side of the fifth surface 122 of the second resin insulating layer 120.

The second via conductor 140 is formed in the opening 126. The second via conductor 140 connects the second conductor layer 30 and the third conductor layer 130. In FIG. 1, the second via conductor 140 connects the land 36 and the land 136. The second via conductor 140 is formed of a seed layer (130a) and an electrolytic plating layer (130b) on the seed layer (130a). The seed layer (130a) forming the second via conductor 140 and the seed layer (130a) forming the third conductor layer 130 are common. The first layer (131a) is in contact with the inner wall surface 127.

FIG. 2 illustrates an enlarged cross-sectional view of the first signal wiring 32 of the second conductor layer 30. As illustrated in FIG. 2, the first signal wiring 32 is formed by the seed layer (30a) on the first surface 22 of the first resin insulating layer 20 and the electrolytic plating layer (30b) on the seed layer (30a). The seed layer (30a) includes the first layer (31a) on the first surface 22 and the second layer (31b) on the first layer (31a). The first layer (31a) is in contact with the first surface 22. A surface of the first layer (31a) facing the first surface 22 is formed along a surface shape of the first surface 22. The second layer (31b) adheres to the electrolytic plating layer (30b). The electrolytic plating layer (30b) is formed directly above the second layer (31b).

As illustrated in FIG. 2, a width of the seed layer (30a) of the first signal wiring 32 (a length in a left-right direction in the drawing) is smaller than a width of the electrolytic plating layer (30b). The width of the first signal line 32 is smallest at a boundary portion (B) between the seed layer (30a) and the electrolytic plating layer (30b). A width (D2) of the first layer (31a) is larger than a width (D3) of the second layer (31b), and a width (D1) of the electrolytic plating layer (30b) is larger than the width (D2) of the first layer (31a). In the cross section of the first signal wiring 32, a first angle (θ1) between a side surface of the seed layer (30a) and the first surface 22 is larger than a second angle (θ2) between the first surface 22 and a straight line from a bottom edge of a side surface of the electrolytic plating layer (30b) toward the boundary portion (B).

As illustrated in FIG. 2, the width (D1) is a distance between side surfaces of the first signal wiring 32. The width (D1) is measured near an upper surface of the first signal wiring 32. The upper surface of the first signal wiring 32 is a surface away from the first surface 22. The width (D2) is measured on the first surface 22. The width (D3) is measured at an interface between the second layer (31b) and the electrolytic plating layer (30b).

A specific portion (S) of the second resin insulating layer 120 located between the electrolytic plating layer (30b) and the first surface 22 beside the seed layer (30a) of the first signal wiring 32 contains the second inorganic particles 192. Sizes of the second inorganic particles 192 contained in the specific portion (S) are smaller than sizes of the second inorganic particles 192 contained in other portions. The sizes of the second inorganic particles 192 contained in the specific portion (S) are, for example, 1.0 µm or less. The specific portion (S) has a width corresponding to "C" in FIG. 2. The width of the specific portion (S) is about 1.0 µm. (See FIG. 2)

The side surface of the electrolytic plating layer (30b) is virtually extended to the first surface 22. The side surface is a surface used for measuring the width (D1). A surface obtained by the extension is referred to as a virtual surface. The virtual surface does not include the side surface of the electrolytic plating layer (30b). A portion surrounded by the virtual surface, the first surface 22 and the side surface of the first signal wiring 32 is the specific portion (S).

FIG. 2 illustrates the first signal wiring 32. However, other conductor circuits (the second signal wiring 34 and the land 36) in the second conductor layer 30 also have the same structure as the first signal wiring 32. The conductor circuits (the first signal wiring 132, the second signal wiring 134, and the land 136) in the third conductor layer 130 also have the same structure as the first signal wiring 32.

Method for Manufacturing Printed Wiring Board

Figure 3A:
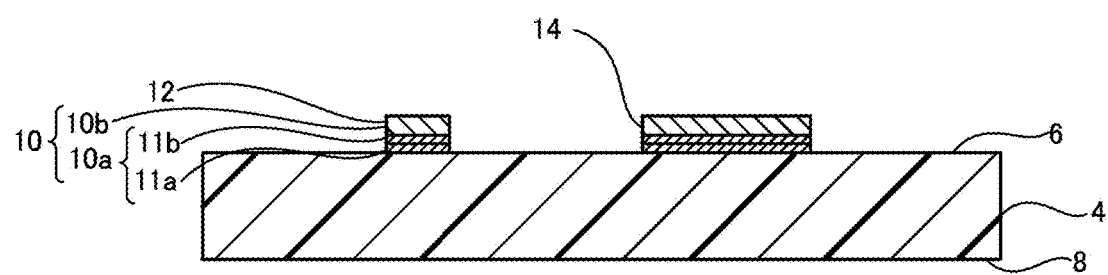
FIG. 3A is a cross-sectional view schematically illustrating a method for manufacturing a printed wiring board according to an embodiment of the present invention.
Figure 3B:
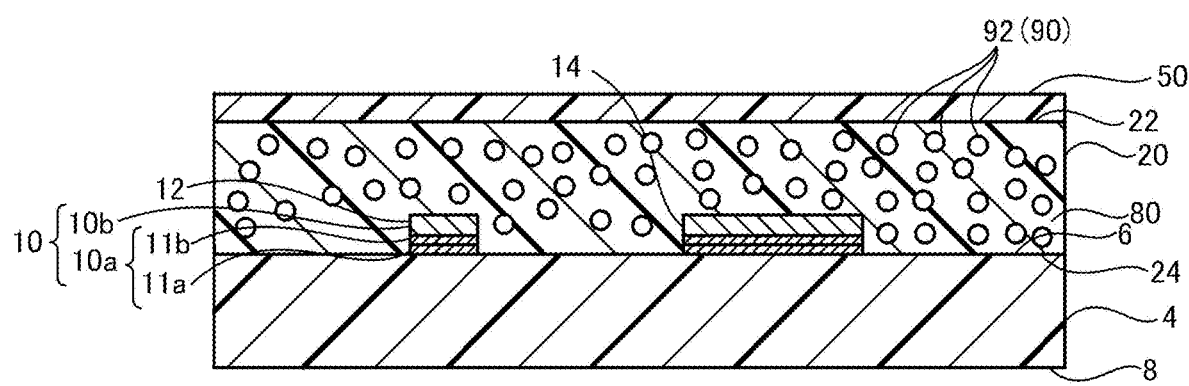
FIG. 3B is a cross-sectional view schematically illustrating a method for manufacturing a printed wiring board according to an embodiment of the present invention.
Figure 3C:
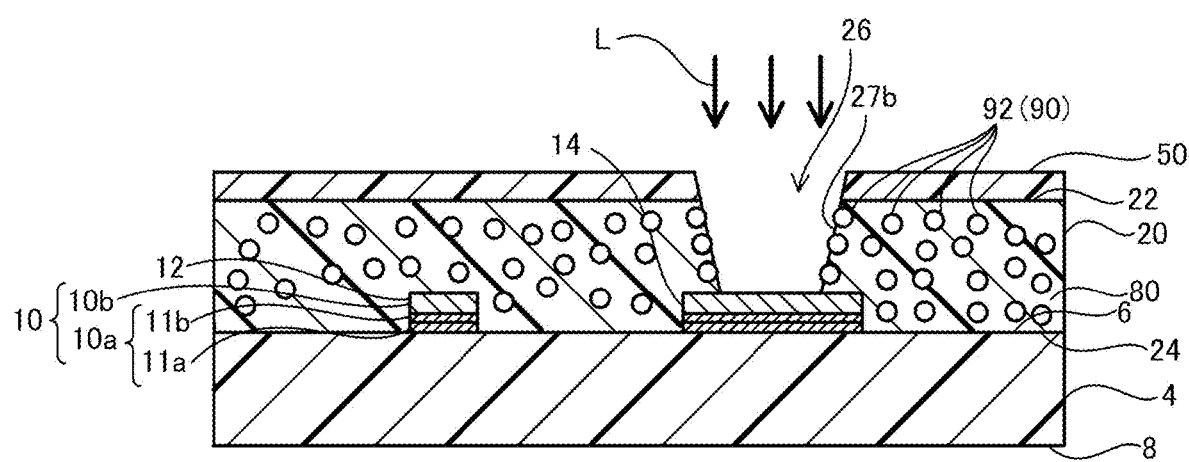
FIG. 3C is a cross-sectional view schematically illustrating a method for manufacturing a printed wiring board according to an embodiment of the present invention.
Figure 3D:
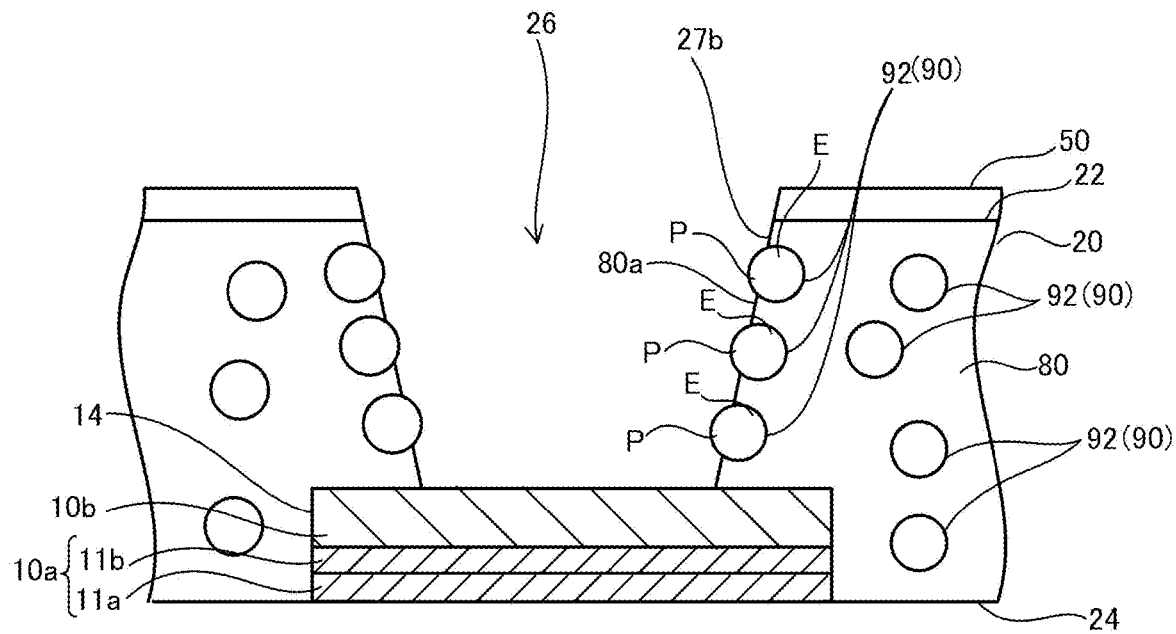
FIG. 3D is an enlarged cross-sectional view schematically illustrating a method for manufacturing a printed wiring board according to an embodiment of the present invention.
Figure 3E:
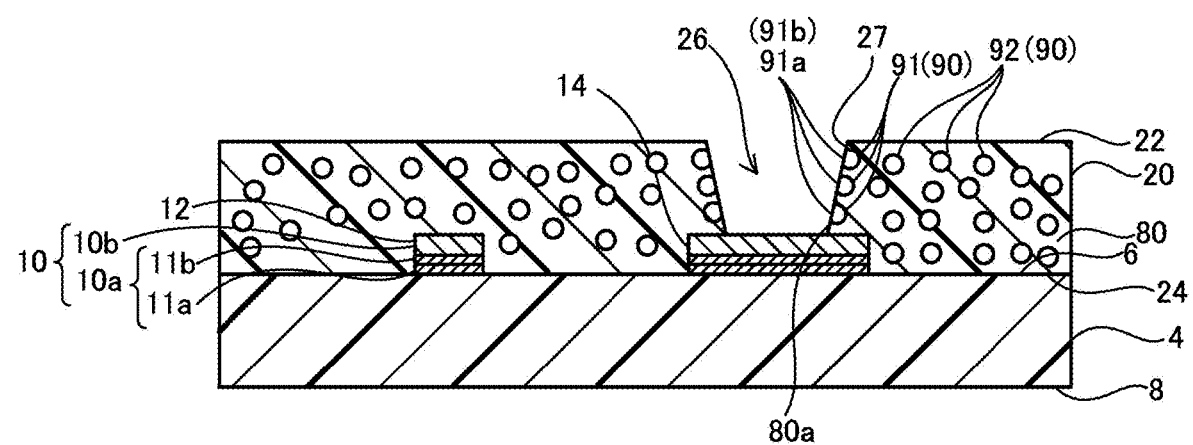
FIG. 3E is a cross-sectional view schematically illustrating a method for manufacturing a printed wiring board according to an embodiment of the present invention.

FIGS. 3A-3H illustrate a method for manufacturing the printed wiring board 2 of the embodiment. FIGS. 3A-3C and 3E-3H are cross-sectional views. FIG. 3D is an enlarged cross-sectional view. FIG. 3A illustrates the insulating layer 4 and the first conductor layer 10 formed on the third surface 6 of the insulating layer 4. The first conductor layer 10 is formed using a semi-additive method. The first layer (11a) and second layer (11b) are formed by sputtering. The electrolytic plating layer (10b) is formed by electrolytic plating.

As illustrated in FIG. 3B, the first resin insulating layer 20 and a protective film 50 are formed on the insulating layer 4 and the first conductor layer 10. The second surface 24 of the first resin insulating layer 20 faces the third surface 6 of the insulating layer 4. The protective film 50 is formed on the first surface 22 of the first resin insulating layer 20. The first resin insulating layer 20 has the resin 80 and the inorganic particles 90 (the second inorganic particles 92). The inorganic particles 90 are embedded in the resin 80.

The protective film 50 completely covers the first surface 22 of the first resin insulating layer 20. An example of the protective film 50 is a film formed of polyethylene terephthalate (PET). A release agent is formed between the protective film 50 and the first resin insulating layer 20.

As illustrated in FIG. 3C, laser (L) is irradiated from above the protective film 50. The laser (L) penetrates the protective film 50 and the first resin insulating layer 20 at the same time. The opening 26 for a via conductor reaching the pad 14 of the first conductor layer 10 is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

FIG. 3D illustrates an inner wall surface (27b) of the opening 26 after the laser irradiation. The inner wall surface (27b) is formed of the resin 80 and the inorganic particles 90 protruding from the resin 80. In order to control the shape of the inner wall surface, the inner wall surface (27b) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27b) after the laser irradiation with a chemical. Or, the inorganic particles 90 protruding from the resin 80 are selectively removed by treating the inner wall surface (27b) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27b) after the laser irradiation, the first inorganic particles 91 having the flat parts (see FIG. 1) are obtained. By controlling conditions for treating the inner wall surface (27b) after the laser irradiation, a shape of the inner wall surface 27 can be controlled. Examples of the conditions are a temperature, a concentration, a time, a type of gas, and a pressure. The etching rate of the inorganic particles 90 and the etching rate of the resin are controlled.

By irradiating the first resin insulating layer 20 with the laser (L), some of the second inorganic particles 92 embedded in the resin 80 form the inner wall surface (27b) after the laser irradiation. As illustrated in FIG. 3D, the second inorganic particles 92 forming the inner wall surface (27b) after the laser irradiation are each formed of a protruding portion (P) protruding from the resin 80 and a portion (E) embedded in the resin 80. The inner wall surface (27b) after the laser irradiation is treated. For example, the inner wall surface (27b) is treated with plasma of a gas containing tetrafluoromethane. The protruding portions (P) are selectively removed to form the inner wall surface 27 of the embodiment. The first inorganic particles 91 are formed from the second inorganic particles 92. As illustrated in FIG. 3E, by selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface 27 is formed of the flat parts (91a) and the surface (80a) of the resin 80, and exposed surfaces (91b) of the flat parts (91a) and the surface (80a) of the resin 80 are substantially positioned on the same flat surface. For example, when the seed layer (30a) is formed on the inner wall surface (27b) by sputtering, the protruding portions (P) inhibit growth of a sputtering film. For example, a continuous seed layer (30a) is not formed on the inner wall surface (27b). Or, the seed layer (30a) is increased in thickness. A fine conductor circuit cannot be formed. In the embodiment, the protruding portions (P) are removed. The seed layer (30a) formed by sputtering can be reduced in thickness. Even when the seed layer (30a) formed by sputtering is thin, a continuous seed layer (30a) can be obtained. When the inner wall surface 27 is formed of the exposed surfaces (91b) of the flat parts (91a) and the surface (80a) of the resin 80, the first layer (31a) and the second layer (31b), each having a small thickness, can be formed. Since the thickness of the first layer (31a) and the thickness of the second layer (31b) are small, the width (D1), the width (D2) and the width (D3) can be easily controlled. The width (D1), the width (D2), and the width (D3) are formed as intended.

Forming the opening 26 includes forming the inorganic particles 90 (the second inorganic particles 92) having the protruding portions (P). The protruding portions (P) protrude from the resin 80 forming the inner wall surface 27 of the opening 26. The first inorganic particles 91 are formed by removing the protruding portions (P) of the inorganic particles 90 (the second inorganic particles 92). The inner wall surface 27 of the opening 26 includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The inner wall surface 27 of the opening 26 is actually a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface 27 formed with a substantially curved surface.

No unevenness is formed on the inner wall surface 27. The inner wall surface 27 is formed smooth. By controlling the conditions for treating the inner wall surface (27b) after the laser irradiation, a size of unevenness is controlled.

The inside of the opening 26 is cleaned. By cleaning the inside of the opening 26, resin residues generated when the opening 26 is formed are removed. The cleaning of the inside of the opening 26 is performed using plasma. That is, the cleaning is performed in a dry process. A gas of the dry process is a mixed gas of a halogen-based gas (such as a fluorine-based gas or a chlorine-based gas) and an $O_2$ gas, or is a halogen-based gas (such as a fluorine-based gas or a chlorine-based gas) or an $O_2$ gas alone. The cleaning includes a desmear treatment. The first surface 22 of the first resin insulating layer 20 is covered by the protective film 50, and thus, is not affected by the plasma. No unevenness is formed on the first surface 22 of the first resin insulating layer 20. The first surface 22 is not roughened.

When treating the inner wall surface (27b) after the laser irradiation includes cleaning the inside of the opening 26, cleaning the inside of the opening 26 can be omitted.

As illustrated in FIG. 3E, after cleaning the inside of the opening 26, the protective film 50 is removed from the first resin insulating layer 20. When treating the inner wall surface (27b) after the laser irradiation includes cleaning the inside of the opening 26, the protective film 50 is removed from the first resin insulating layer 20 after treating the inner wall surface (27b) after the laser irradiation. When the inner wall surface (27b) after the laser irradiation is treated, the protective film 50 covers the first surface 22 of the first resin insulating layer 20. After the protective film 50 is removed, the first surface 22 of the first resin insulating layer 20 is not roughened. Therefore, the first surface 22 is formed smooth. The first surface 22 has an arithmetic mean roughness (Ra) of 0.02 μm or more and 0.06 μm or less.

Figure 3F:
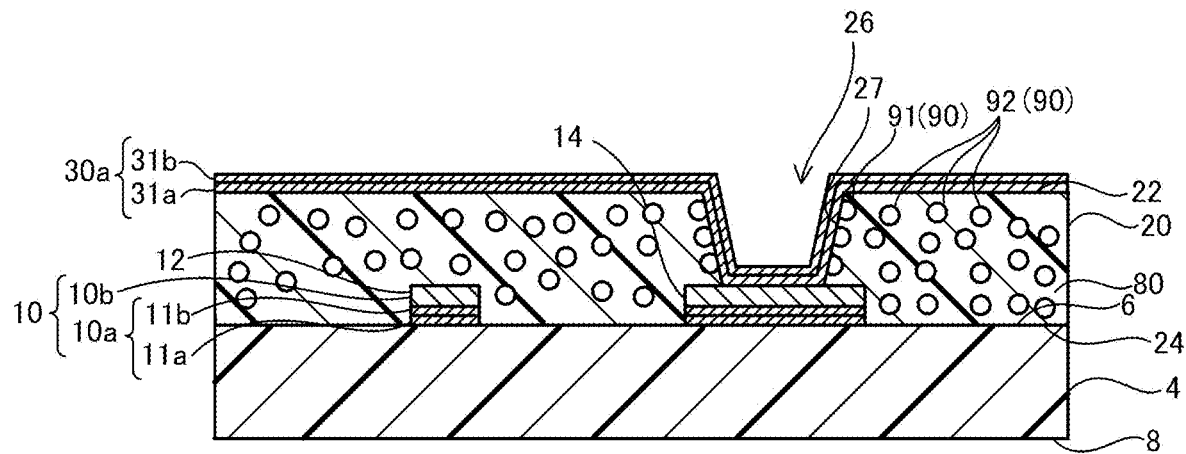
FIG. 3F is a cross-sectional view schematically illustrating a method for manufacturing a printed wiring board according to an embodiment of the present invention.

As illustrated in FIG. 3F, the seed layer (30a) is formed on the first surface 22 of the first resin insulating layer 20. The seed layer (30a) is formed by sputtering. The formation of the seed layer (30a) is performed in a dry process. The seed layer (30a) has the first layer (31a) and the second layer (31b) formed on the first layer (31a) using a material different from that of the first layer (31a). The first layer (31a) and the second layer (31b) are formed of a combination of copper alloys of different materials, or a combination of a copper alloy and copper. The first layer (31a) is formed of a copper alloy. Adhesion strength between a copper alloy and the first resin insulating layer 20 is larger than adhesion strength between copper and the first resin insulating layer 20. The second layer (31b) is formed of a copper alloy or copper. The copper alloy has a copper content of 90 wt % or more. Since the higher the copper content is, the lower the electrical resistance can be reduced, connection reliability can be improved. The thickness of the seed layer (30a) is 0.02 μm or more and 1 μm or less, preferably 0.03 μm or more and 0.5 μm or less, and more preferably 0.05 μm or more and 0.3 μm or less. The first surface 22 has an arithmetic mean roughness (Ra) of 0.02 μm or more and 0.06 μm or less. When the thickness of the seed layer (30a) is 0.02 μm or less, it is difficult to form the seed layer (30a) uniformly over the entire surface of the first resin insulating layer 20. When the thickness is 1.0 μm or more, it is difficult to control the wiring width of the electrolytic plating layer (30b) when the seed layer is removed. The first layer (31a) is formed on the first surface 22 by sputtering. The thickness of the first layer (31a) is 0.01 μm or more and 0.5 μm or less, preferably 0.02 μm or more and 0.3 μm or less, and more preferably 0.03 μm or more and 0.1 μm or less. When the thickness of the first layer (31a) is 0.01 μm or less, adhesion between the first layer (31a) and the first resin insulating layer 20 is reduced. When the thickness of the first layer (31a) is 0.5 μm or more, wiring resistance increases. The second layer (31b) is formed on the first layer (31a) by sputtering. The thickness of the second layer (31b) is 0.01 μm or more and 0.9 μm or less, preferably 0.02 μm or more and 0.3 μm or less, and more preferably 0.03 μm or more and 0.2 μm or less. When the thickness of the second layer (31b) is 0.01 μm or less, wiring resistance increases. When the thickness of the second layer (31b) is 0.9 μm or more, the first layer (31a) is formed thin, and thus, adhesion between a wiring and the first resin insulating layer 20 is reduced. The seed layer (30a) is formed along a surface shape of the first surface 22. The seed layer (30a) forming the conductor circuits (the first signal wiring 32, the second signal wiring 34 and the land 36) in the second conductor layer 30 does not enter the inner side of the first resin insulating layer 20. When the seed layer (30a) is removed, an etching amount can be reduced. The conductive circuits are unlikely to be excessively etched. The widths of the conductor circuits can be made close to design values. The seed layer (30a) is also formed on the upper surface of the pad 14 exposed from the opening 26 and on the inner wall surface 27 of the opening 26. The first layer (31a) is formed of a copper alloy containing copper and a metal other than copper. The second layer (31b) is formed of copper.

Figure 3G:
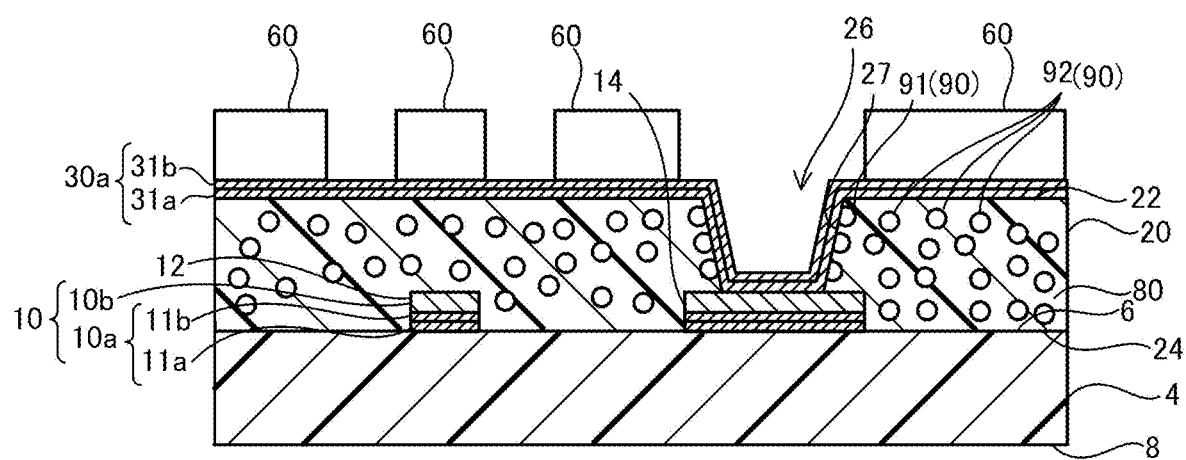
FIG. 3G is a cross-sectional view schematically illustrating a method for manufacturing a printed wiring board according to an embodiment of the present invention.

As illustrated in FIG. 3G, a plating resist 60 is formed on the seed layer (30a). The plating resist 60 has openings for forming the first signal wiring 32, the second signal wiring 34, and the land 36 (FIG. 1).

Figure 3H:
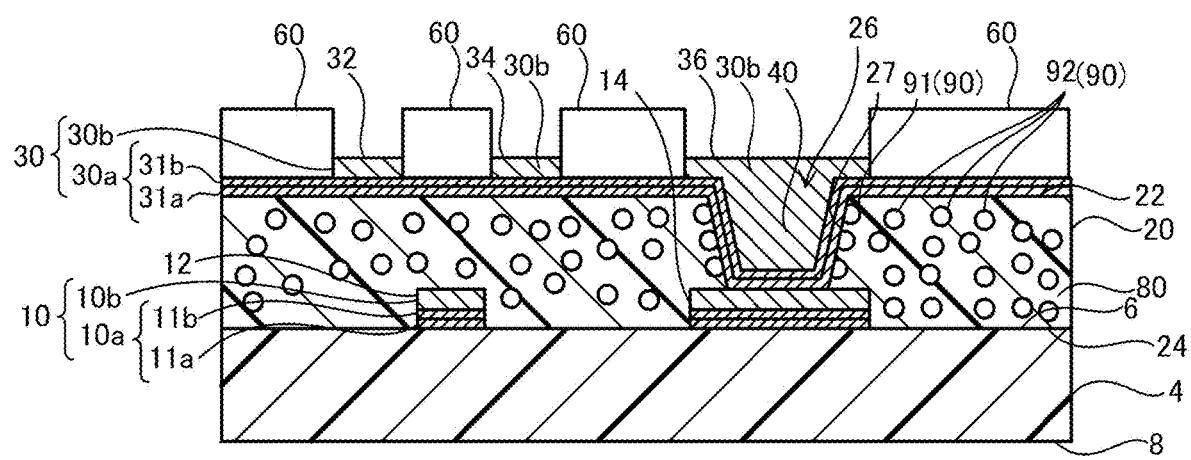
FIG. 3H is a cross-sectional view schematically illustrating a method for manufacturing a printed wiring board according to an embodiment of the present invention.

As illustrated in FIG. 3H, the electrolytic plating layer (30b) is formed on the seed layer (30a) exposed from the plating resist 60. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The first via conductor 40 is formed by the seed layer (30a) and the electrolytic plating film (30b) in the opening 26. The first via conductor 40 connects the pad 14 and the land 36. The first signal wiring 32 and the second signal wiring 34 form a pair wiring.

The plating resist 60 is removed. The seed layer (30a) exposed from the electrolytic plating layer (30b) is removed by etching. The second conductor layer 30 and the first via conductor 40 are formed at the same time. The width of the first layer (31a) is larger than the width of the second layer (31b), and the width of the electrolytic plating layer (30b) is larger than the width of the first layer (31a). An etching rate of the seed layer (30a) is higher than an etching rate of the electrolytic plating layer (30b). The etching rate of the seed layer is 1.1-1.5 times the etching rate of the electrolytic plating layer. The seed layer (30a) formed by sputtering has a higher ratio of an amorphous structure part to a metal crystal part compared to the electrolytic plating layer (30b). An amorphous structure part has many crystal defects. The more crystal defects there are, the higher the etching rate is. The etching rate of the seed layer (30a) is higher than the etching rate of the electrolytic plating layer (30b). Therefore, when the seed layer (30a) is removed, an etching amount of the electrolytic plating layer (30b) is small. The conductive circuits are unlikely to be excessively etched. The widths of the conductor circuits can be made close to design values. When the seed layer (30a) is removed by etching, the width of the seed layer (30a) of each of the conductive circuits (the first signal wiring 32, the second signal wiring 34, and the land 36) of the second conductor layer 30 is smaller than the width of the electrolytic plating layer (30b). When the first layer (31a) is formed of a copper alloy and the second layer (31b) is formed of copper, only the first layer (31a) is formed of an alloy. Therefore, the difference in etching rate between the two can be increased. As an etching solution for removing the seed layer (30a), an etching solution that dissolves the second layer (31b) more than the first layer (31a) is preferable. A width of a wiring (a distance between sidewalls of the wiring) is smallest at the boundary portion (B) between the second layer (31b) and the electrolytic plating layer (30b). Since a stress is the largest at the boundary portion (B), the adhesion between the first layer (31a) and the first resin insulating layer 20 is improved.

Since the flat parts (91a) of the first inorganic particles 91 form the inner wall surface 27, the thickness of the first layer (31a) can be reduced. The thickness of the first layer (31a) is sufficiently smaller than the thickness of the electrolytic plating layer (30b). Therefore, orientation of the particles forming the first layer (31a) tends to be lower than orientation of the particles forming the electrolytic plating layer (30b). Or, a density of the first layer (31a) tends to be smaller than a density of the electrolytic plating layer (30b). Or, crystallinity of the first layer (31a) tends to be lower than crystallinity of the electrolytic plating layer (30b). Since the flat parts (91a) of the first inorganic particles 91 form the inner wall surface 27, the thickness of the second layer (31b) can be reduced. The thickness of the second layer (31b) is sufficiently smaller than the thickness of the electrolytic plating layer (30b). Therefore, orientation of the particles forming the second layer (31b) tends to be lower than the orientation of the particles forming the electrolytic plating layer (30b). Or, a density of the second layer (31b) tends to be smaller than the density of the electrolytic plating layer (30b). Or, crystallinity of the second layer (31b) tends to be lower than the crystallinity of the electrolytic plating layer (30b). Therefore, the etching rate of the first layer (31a) and the second layer (31b) is higher than the etching rate of the electrolytic plating layer (30b). When the seed layer (30a) exposed from the electrolytic plating layer (30b) is removed, the width (D1) of the electrolytic plating layer (30b) is larger than the width (D2) of the first layer (31a). The width (D1) of the electrolytic plating layer (30b) is larger than the width (D3) of the second layer (31b). The etching rate of the electrolytic plating layer (30b) is smaller than the etching rate of the seed layer (30a). Therefore, an amount of a dissolved component in an etching solution consumed for dissolving the electrolytic plating layer (30b) is small. According to the embodiment, a dissolved component sufficiently reaches the seed layer (30a). The seed layer (30a) efficiently dissolves. A signal wiring having a width of a target value can be formed. The first layer (31a) is covered by the second layer (31b). A dissolved ingredient is consumed for dissolving the second layer (31b). Therefore, an amount of dissolution of the first layer (31a) can be smaller than an amount of dissolution of the second layer (31b). When the seed layer (30a) exposed from the electrolytic plating layer (30b) is removed, the width (D2) of the first layer (31a) is larger than the width (D3) of the second layer (31b).

In the cross section of the first signal wiring 32, the first angle (θ1) between the side surface of the seed layer (30a) and the first surface 22 is larger than the second angle (θ2) between the first surface 22 and the straight line from the bottom edge of the side surface of the electrolytic plating layer (30b) toward the boundary portion (B). Since the etching rate of the seed layer (30a) is higher than the etching rate of the electrolytic plating layer (30b), the first angle (θ1) is larger than the second angle (θ2). As a result, a depth of the boundary portion (B) can be reduced. Therefore, stress concentration can be relaxed.

The specific portion (S) of the second resin insulating layer 120 located between the electrolytic plating layer (30b) and the first surface 22 beside the seed layer (30a) of the first signal wiring 32 contains the second inorganic particles 192. The sizes of the second inorganic particles 192 contained in the specific portion (S) are smaller than the sizes of the second inorganic particles 192 contained in other portions. The sizes of the second inorganic particles 192 contained in the specific portion (S) are, for example, 1.0 μm or less. The specific portion (S) is filled with the second inorganic particles 192 having small sizes and the resin 180 of the second resin insulating layer 120. A resin content in the resin insulating layer formed in the specific portion (S) is larger than a resin content in the resin insulating layer in other portions. Therefore, a stress generated at an interface between the seed layer (30a) and the electrolytic plating layer (30b) is relaxed.

After that, on the second conductor layer 30 and the first surface 22, the second resin insulating layer 120, the third conductor layer 130 and the second via conductor 140 are formed. The second resin insulating layer 120, the third conductor layer 130, and the second via conductor 140 are formed using the same methods as the first resin insulating layer 20, the second conductor layer 30, and the first via conductor 40. The printed wiring board 2 (FIG. 1) of the embodiment is obtained.

In the printed wiring board 2 of the embodiment, the surface of the second conductor layer 30 facing the first surface 22 is formed along the surface shape of the first surface 22. Therefore, the seed layer (30a) forming the conductor circuits (the first signal wiring 32, the second signal wiring 34 and the land 36) in the second conductor layer 30 does not enter the inner side of the first resin insulating layer 20. The seed layer (30a) can be reduced in thickness. Variation in the thickness of the seed layer (30a) can be reduced. When the seed layer (30a) is removed, the etching amount is small. The conductive circuits are unlikely to be excessively etched. The widths of the conductor circuits can be made close to design values. A high quality printed wiring board 2 is provided.

In the printed wiring board 2 of the embodiment, the first surface 22 of the first resin insulating layer 20 is mostly formed of the resin 80. A small amount of the inorganic particles 90 are exposed on the first surface 22. Similarly, the fifth surface 122 of the second resin insulating layer 120 is formed mostly of the resin 180. A small amount of the inorganic particles 190 are exposed on the fifth surface 122. No unevenness is formed on the first surface 22 and the fifth surface 122. An increase in standard deviation of a relative permittivity in a portion near the first surface 22 of the first resin insulating layer 20 is suppressed. An increase in standard deviation of a relative permittivity in a portion near the fifth surface 122 of the second resin insulating layer 120 is suppressed. The relative permittivities of the first surface 22 and the fifth surface 122 do not vary significantly depending on a location. Even when the first signal wiring 32 and the second signal wiring 34 are in contact with the first surface 22, a difference in propagation speed of an electric signal between the first signal wiring 32 and the second signal wiring 34 can be reduced. Similarly, even when the first signal wiring 132 and the second signal wiring 134 are in contact with the fifth surface 122, a difference in propagation speed of an electric signal between the first signal wiring 132 and the second signal wiring 134 can be reduced. Therefore, in the printed wiring board 2 of the embodiment, noise is suppressed. Even when a logic IC is mounted on the printed wiring board 2 of the embodiment, data transmitted via the first signal wirings (32, 132) and data transmitted via the second signal wirings (34, 134) arrive at the logic IC substantially without delay. Malfunction of the logic IC can be suppressed. Even when lengths of the first signal wirings (32, 132) and lengths of the second signal wirings (34, 134) are 5 mm or more, a difference in propagation speed between the two can be reduced. Even when the lengths of the first signal wirings (32, 132) and the lengths of the second signal wirings (34, 134) are 10 mm or more and 20 mm or less, malfunction of the logic IC can be suppressed. A high quality printed wiring board 2 is provided.

Another Example

In another example of the embodiment, the first layers (11a, 31a, 131a) of the seed layers (10a, 30a, 130a) are each formed of any one metal of silicon, aluminum, titanium, nickel, chromium, carbon, oxygen, tin, calcium, magnesium, iron, molybdenum, and silver. The second layers (11b, 31b, 131b) are formed of copper. In the embodiment and the example, when the second layers (11b, 31b, 131b) are formed of copper, the copper content (atomic weight %) is 99.9% or more, and preferably 99.95% or more.

Japanese Patent Application Laid-Open Publication No. H11-214828 describes a printed wiring board having an insulating layer and a conductive circuit formed on the insulating layer. A surface of the insulating layer is roughened. The conductor circuit is formed by an electroless plating film formed following the roughened surface of the insulating layer and an electrolytic plating film formed on the electroless plating film.

In the technology of Japanese Patent Application Laid-Open Publication No. H11-214828, as illustrated in FIG. 9 of Japanese Patent Application Laid-Open Publication No. H11-214828, a part of the electroless plating film enters an inner side of the surface of the insulating layer. It is thought that when the electroless plating film is removed, an etching amount is large. It is thought that the electroless plating film is excessively removed. It is thought difficult to adjust a width of the conductor circuit to a design value. It is thought that a high quality printed wiring board is not provided.

A printed wiring board according to an embodiment of the present invention includes: a first conductor layer; a first resin insulating layer that is formed on the first conductor layer, and has a via conductor opening exposing the first conductor layer, a first surface, and a second surface on the opposite side with respect to the first surface; a second conductor layer that is formed on the first surface of the first resin insulating layer; and a via conductor that is formed in the opening and connects the first conductor layer and the second conductor layer. The second conductor layer and the via conductor are formed by a seed layer and an electrolytic plating layer formed on the seed layer. A surface of the second conductor layer facing the first surface is formed along a surface shape of the first surface. The second conductor layer has a conductor circuit. The seed layer has a first layer and a second layer formed on the first layer. The conductor circuit is formed of the first layer, the second layer, and the electrolytic plating layer in order from a side closest to the first resin insulating layer. And, in a cross section of the conductor circuit, a width of the first layer is larger than a width of the second layer, and a width of the electrolytic plating layer is larger than the width of the first layer.

In a printed wiring board according to an embodiment of the present invention, the surface of the second conductor layer facing the first surface is formed along the surface shape of the first surface. Therefore, the seed layer forming the conductor circuit in the second conductor layer does not enter an inner side of the first resin insulating layer. When the seed layer is removed, an etching amount can be reduced. The conductive circuit is unlikely to be excessively etched. A width of the conductor circuit can be made close to a design value. By making the width of the first layer larger than the width of the second layer, adhesion between the second conductor layer and the first resin insulating layer can be increased. A high quality printed wiring board can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer;
a second conductor layer formed on a surface of the resin insulating layer and including a conductor circuit such that the conductor circuit includes a signal wiring; and
a via conductor formed in an opening formed in the resin insulating layer such that the via conductor is connecting the first conductor layer and the second conductor layer,
wherein the second conductor layer and the via conductor include a seed layer and an electrolytic plating layer formed on the seed layer such that the seed layer has a first layer and a second layer formed on the first layer, that the first layer has a width that is greater than a width of the second layer in a cross section of the conductor circuit in the second conductor layer and that the electrolytic plating layer has a width that is greater than the width of the first layer in the cross section of the conductor circuit in the second conductor layer, and the second conductor layer includes a plurality of conductor circuits such that the plurality of conductor circuits includes the conductor circuit including the signal wiring and a conductor circuit other than a signal wiring.

2. The printed wiring board according to claim 1, wherein the seed layer is formed such that a surface of the second layer is adhering to the electrolytic plating layer.

3. The printed wiring board according to claim 1, wherein the second conductor layer is formed such that a width of the seed layer in the conductive circuit is smaller than a width of the electrolytic plating layer in the conductive circuit in the cross section of the conductor circuit and that the conductor circuit has a width that is smallest at a boundary portion between the seed layer and the electrolytic plating layer in the cross section of the conductor circuit.

4. The printed wiring board according to claim 3, wherein the second conductor layer is formed such that a first angle between a side surface of the seed layer and the surface of the resin insulating layer is greater than a second angle between the surface of the resin insulating layer and a straight line from a bottom edge of a side surface of the electrolytic plating layer toward a boundary portion between the seed layer and the electrolytic plating layer in the cross section of the conductor circuit.

5. The printed wiring board according to claim 3, further comprising:
a second resin insulating layer formed on the second conductor layer such that the second resin insulating layer includes a resin material and inorganic particles and that sizes of the inorganic particles are 1.0 μm or less in a portion of the second resin insulating layer between the electrolytic plating layer in the conductor circuit and the surface of the resin insulating layer beside the seed layer in the conductor circuit.

6. The printed wiring board according to claim 3, wherein the resin insulating layer is formed such that the surface of the resin insulating layer has an arithmetic mean roughness Ra in a range of 0.02 μm to 0.06 μm.

7. The printed wiring board according to claim 3, wherein the seed layer includes the first layer comprising a copper alloy, and the second layer comprising a copper alloy different from the copper alloy of the first layer or copper.

8. The printed wiring board according to claim 7, wherein each of the copper alloys has a copper content of 90 wt % or more.

9. The printed wiring board according to claim 3, wherein the seed layer includes the first layer comprising at least one of one of aluminum, titanium, nickel, chromium, calcium, magnesium, iron, molybdenum and silver, and the second layer comprising copper.

10. The printed wiring board according to claim 1, wherein the second conductor layer is formed such that a first angle between a side surface of the seed layer and the surface of the resin insulating layer is greater than a second angle between the surface of the resin insulating layer and a straight line from a bottom edge of a side surface of the electrolytic plating layer toward a boundary portion between the seed layer and the electrolytic plating layer in the cross section of the conductor circuit.

11. The printed wiring board according to claim 1, further comprising:
a second resin insulating layer formed on the second conductor layer such that the second resin insulating layer includes a resin material and inorganic particles and that sizes of the inorganic particles are 1.0 μm or less in a portion of the second resin insulating layer between the electrolytic plating layer in the conductor circuit and the surface of the resin insulating layer beside the seed layer in the conductor circuit.

12. The printed wiring board according to claim 1, wherein the resin insulating layer is formed such that the surface of the resin insulating layer has an arithmetic mean roughness Ra in a range of 0.02 μm to 0.06 μm.

13. The printed wiring board according to claim 1, wherein the seed layer is formed by sputtering.

14. The printed wiring board according to claim 1, wherein the seed layer includes the first layer comprising a copper alloy, and the second layer comprising a a copper alloy different from the copper alloy of the first layer or copper.

15. The printed wiring board according to claim 14, wherein each of the copper alloys has a copper content of 90 wt % or more.

16. The printed wiring board according to claim 1, wherein the seed layer includes the first layer comprising at least one of one of aluminum, titanium, nickel, chromium, calcium, magnesium, iron, molybdenum and silver, and the second layer comprising copper.

17. The printed wiring board according to claim 1, wherein the seed layer is formed such that the seed layer has a thickness in a range of 0.02 μm to 1.0 μm.

18. The printed wiring board according to claim 1, wherein the seed layer is formed such that the first layer has a thickness in a range of 0.01 μm to 0.5 μm.

19. The printed wiring board according to claim 1, wherein the seed layer is formed such that the second layer has a thickness in a range of 0.01 μm to 0.9 μm.

20. The printed wiring board according to claim 1, wherein the seed layer is formed such that the seed layer has a thickness in a range of 0.02 μm to 1.0 μm.

* * * * *